(12) United States Patent
Tojo et al.

(10) Patent No.: US 6,961,359 B2
(45) Date of Patent: Nov. 1, 2005

(54) SEMICONDUCTOR LASER DEVICE

(75) Inventors: Tsuyoshi Tojo, Miyagi (JP); Shiro Uchida, Miyagi (JP); Satoru Kijima, Miyagi (JP)

(73) Assignee: Sony Corporation, Tokyo (JP)

( * ) Notice: Subject to any disclaimer, the term of this patent is extended or adjusted under 35 U.S.C. 154(b) by 221 days.

(21) Appl. No.: 10/655,678

(22) Filed: Sep. 5, 2003

(65) Prior Publication Data

US 2004/0047381 A1    Mar. 11, 2004

Related U.S. Application Data

(62) Division of application No. 10/120,566, filed on Apr. 11, 2002, now Pat. No. 6,711,197.

(51) Int. Cl.$^7$ ................................................ H01S 5/00
(52) U.S. Cl. ........................................ 372/46; 372/45
(58) Field of Search ............................. 372/43–50, 75, 372/96; 257/94, 96, 97, 103; 438/33, 42, 438/462

(56) References Cited

U.S. PATENT DOCUMENTS

| | | | |
|---|---|---|---|
| 5,271,028 A | | 12/1993 | Kondo et al. |
| 5,825,797 A | | 10/1998 | Nagai |
| 5,939,733 A | * | 8/1999 | Sato ............................. 257/94 |
| 5,960,020 A | | 9/1999 | Nagai |
| 5,974,068 A | | 10/1999 | Adachi et al. |
| 5,976,904 A | * | 11/1999 | Gotoh et al. .................. 438/33 |
| 6,232,623 B1 | | 5/2001 | Morita |
| 6,256,331 B1 | * | 7/2001 | Kitoh et al. ................... 372/46 |
| 6,285,694 B1 | * | 9/2001 | Shigihara ...................... 372/45 |
| 6,456,640 B1 | | 9/2002 | Okumura |

FOREIGN PATENT DOCUMENTS

| | | |
|---|---|---|
| JP | 2000-101193 | 4/2000 |
| JP | 2000-35842 | 12/2000 |

\* cited by examiner

*Primary Examiner*—Minsun Harvey
*Assistant Examiner*—Tuan N. Nguyen
(74) *Attorney, Agent, or Firm*—Sonnenschein, Nath & Rosenthal LLP

(57) ABSTRACT

Disclosed is a nitride based III-V group compound semiconductor laser device of ridge waveguide type with an oscillation wavelength of about 410 nm which has a low driving voltage, a high half-width value $\theta_{//}$ of a FFP in a direction horizontal to a hetero interface, and a high kink level (i.e., good light output-injected current characteristics over the high-output range). This laser device is similar in structure to the related-art semiconductor laser device except for the current constricting layer formed in a ridge. It has a stacked film composed of an SiO$_2$ film (600 Å thick) and an amorphous Si film (300 Å thick) which are formed on the SiO$_2$ film by vapor deposition. The stacked film covers both sides of the ridge and a p-AlGaN cladding layer extending sideward from the base of the ridge. The SiO$_2$ film and Si film have respective thicknesses which are established such that the absorption coefficient of fundamental horizontal lateral mode is larger than the absorption coefficient of primary horizontal lateral mode. This structure results in a higher kink level, while suppressing the high-order horizontal lateral mode, a larger effective refractive index difference Δn, and a larger value of $\theta_{//}$ without the necessity for reducing the ridge width.

9 Claims, 16 Drawing Sheets

SEMICONDUCTOR LASER DEVICE

The present application is a divisional of U.S. application Ser. No. 10/120,566 filed Apr. 11, 2002, now U.S. Pat. No. 6,711,197 which claims priority to JP 2001-114268, filed Apr. 12, 2001, both of which are incorporated herein by reference to the extent permitted by law.

BACKGROUND OF THE INVENTION

The present invention relates to a semiconductor laser device of ridge waveguide type. More particularly, the present invention relates to a semiconductor laser device of ridge waveguide type which has a desirably controlled half-width value $\theta_{//}$ of a far field pattern (FFP) in a direction horizontal to a hetero interface, exhibits good laser characteristics during high-output operation and merely requires a low driving voltage.

Semiconductor laser devices of ridge waveguide type, including those which are based on GaAs or InP for long wavelengths and a nitride based III-V group compound for short wavelengths, find use in a various application areas because they are easy to manufacture.

The semiconductor laser device of ridge waveguide type belongs to the category of index guided device. It has an upper portion of an upper cladding layer and a contact layer, both resembling a striped-shaped ridge. The ridge is formed such that an insulating film covers both sides of the ridge and the upper cladding layer extending sideward from the base of the ridge. This insulating film functions as a layer to constrict electric current and provides an effective refractive index difference in the lateral direction for mode control.

An explanation is given below, with reference to FIG. 11, of the structure of a related-art nitride based III-V group compound semiconductor laser device of ridge waveguide type which emits light with a wavelength of about 410 nm. This laser device is referred to as "nitride based semiconductor laser device" hereinafter.

FIG. 11 shows a related-art nitride based semiconductor laser device of ridge waveguide type 10 has basically a stacked structure in which a plularity of layers are stacked on a sapphire substrate 12. The plularity of layers stacked on the sapphire substrate 12 are a laterally grown GaN layer 14, an n-GaN contact layer 16, an n-AlGaN cladding layer 18, an active layer 20, a p-AlGaN cladding layer 22, and a p-GaN contact layer 24.

In the stacked structure, the upper portion of the p-AlGaN cladding layer 22 and the p-GaN contact layer 24 are formed as a striped-shaped ridge 26. A mesa structure extending in the same direction as the ridge 26 is formed by the upper portion of the n-GaN contact layer 16, the n-AlGaN cladding layer 18, the active layer 20, and the remaining portion 22a of the p-AlGaN cladding layer 22.

The ridge 26 has a width (W) of about 1.7 μm. The remaining portion 22a of the p-AlGaN cladding layer 22 which extends sideward from the base of the ridge 26 has a thickness (T) of about 0.17 μm.

An insulating film 28 of $SiO_2$ (about 2000 Å thick) is formed on both sides of the ridge 26, the side of the mesa structure above the p-AlGaN cladding layer 22 extending sideward from the base of the ridge 26, and the n-AlGaN contact layer 16.

On the insulating film 28 is formed a p-side electrode 30, which is in contact with the p-GaN contact layer 24 through a window in the insulating film 28. On the n-GaN contact layer 16 is formed an n-side electrode 32.

The nitride based semiconductor laser device of ridge waveguide type 10 mentioned above is considered as a highly efficient one because the insulating film 28 covering both sides of the ridge 26 is transparent to the emitted laser beam with little waveguide loss and the threshold current is small.

In the meantime, as its application areas expand, the nitride based semiconductor laser device of ridge waveguide type is required to have a higher kink level so that it maintains good characteristic property for light output vs. injected current throughout the region up to the high-output level. It is also required to have a larger half-width value $\theta_{//}$ of a far field pattern (FFP) in a direction horizontal to the hetero interface.

For example, in the case where the nitride based semiconductor laser device is used as a light source of an optical pickup, it is required to have a larger half-width value $\theta_{//}$.

The results of the present inventors' investigation revealed that the value of $\theta_{//}$ is related closely with the difference (Δn) of effective refractive index of the ridge waveguide, as shown in FIG. 12. In order to obtain a larger value of $\theta_{//}$, it is necessary to have a larger value of Δn. Incidentally, the difference (Δn) of effective refractive index of the ridge waveguide is defined as $n_{eff1} - n_{eff2}$ or a difference between $n_{eff1}$ which is the effective refractive index of the ridge for the oscillation wavelength and $n_{eff2}$ which is the effective refractive index of the ridge's side, as shown in FIG. 11. Closed and open circles in FIG. 12 denote the values obtained by experiments.

Unfortunately, any attempt to increase the value of Δn ends up with a narrow cutoff ridge width of high-order horizontal lateral mode. The cutoff ridge width of high-order horizontal lateral mode is defined as a ridge width which gives rise to no high-order horizontal lateral mode. When the ridge width is larger than the cutoff ridge width, the horizontal lateral mode tends to shift from the fundamental mode to the primary high-order mode at the time of laser oscillation.

When a hybrid mode consisting of the fundamental horizontal lateral mode and the high-order horizontal lateral mode occurs, a kink occurs in the light output-injected current characteristics, as shown in FIG. 13. The result is a deterioration in the laser characteristics at the time of high-output operation.

The foregoing holds true particular for the nitride based semiconductor laser device of ridge wave-guide type, which has a small value of Δn and a short oscillation wavelength and hence has a narrow cutoff ridge width of high-order horizontal lateral mode, as shown in FIG. 14. FIG. 14 is a graph showing the relation between the value of Δn and the cutoff ridge width in the case where the GaN layer has a refractive index of 2.504 and an oscillation wavelength (λ) of 400 nm. Δn stands for the difference between the effective refractive index of the ridge and the effective refractive index of the ridge's side. For example, if the value of Δn is 0.005 to 0.01, the ridge width should be reduced to about 1 μm so that the ridge width is smaller than the cutoff ridge width.

As mentioned above, any attempt to increase the value of Δn, thereby increasing the value of $\theta_{//}$, ends up with a decreased cutoff ridge width, which leads to a deterioration in laser characteristics at the time of high-output operation. In other words, there is a trade-off for ridge width between the value of $\theta_{//}$ and the laser characteristics at the time of high-output operation.

Moreover, the nitride based semiconductor laser device of ridge waveguide type has found an increasing use in the area of portable machines. The one for this purpose is required to have a lower drive voltage. One way to reduce the drive voltage is to increase the ridge width so that the contact area between the contact layer and the p-side electrode is increased. However, this suffers the disadvantage that the ridge width exceeds the cutoff ridge width, resulting in a deterioration in the laser characteristics at the time of high-output operation. In other words, there is a trade-off for the ridge width between the reduced drive voltage and the improved laser characteristics at the time of high-output operation.

The foregoing indicates that reducing the ridge width, thereby improving the laser characteristics at the time of high-output operation, contradicts increasing the value of $\theta_{//}$ and decreasing the drive voltage.

As mentioned above, the related-art nitride based semiconductor laser device poses several problems. That is, it does not permit the ridge width to be decreased appreciably in order to keep its drive voltage low. Also, it has a ridge width lager than its cutoff ridge width, which prevents the kink level from being raised to a desired high level in the light output-injected current characteristics. The result is that the value of $\Delta n$ is small and the value of $\theta_{//}$ is also small.

The foregoing is applicable not only to nitride based semiconductor laser devices but also to any semiconductor laser devices (such as GaAs and InP) of ridge waveguide type for longer wavelengths.

SUMMARY OF THE INVENTION

It is an object of the present invention to provide a semiconductor laser device of ridge waveguide type which has a low drive voltage, a large value of $\theta_{//}$, and a high kink level or good light output-injected current characteristics up to a high output range.

The present inventors carried out extensive investigations in search of a semiconductor laser device which has a large value of $\Delta n$ and a large value of $\theta_{//}$ and keeps good light output-injected current characteristics up to a high output range, without the necessity of reducing the ridge width to keep the drive voltage low. As the result, it was found that a difference in absorption coefficient occurs between the fundamental horizontal lateral mode and the primary horizontal lateral mode, as shown in FIG. 15, if stacked layers are sequentially formed on both sides of the ridge, the stacked layers consisting of an insulating film which does not absorb the laser beam appreciably, an insulating film which is substantially transparent to the light of the oscillation wavelength, and a film which absorbs the laser beam.

It was also found that the above-mentioned phenomenon can be utilized to increase the kink level as high as practically acceptable and to increase the value of $\theta_{//}$ without reducing the ridge width.

In addition, the present inventors carried out a series of experiments on the combination of various insulating films and absorption films. As the result, it was found that the insulating films and absorption films in stacked form (each film having a thickness specified in the present invention) suppress the high-order lateral mode. These findings led to the present invention.

The present invention to achieve the above-mentioned object is directed to a semiconductor laser device of ridge waveguide type including: a ridge formed in an upper portion of at least an upper cladding layer, wherein a stacked film composed of an insulating film substantially transparent to the oscillation wavelength and an absorption film formed on the insulating film which absorbs the oscillation wavelength, is formed on both sides of the ridge and on the upper cladding layer extending sideward from the base of the ridge, an electrode film is electrically connected to the upper surface of the ridge through a window in the stacked film, and the insulating film and the absorption film have respective thicknesses such that the absorption coefficient of high-order horizontal lateral mode is larger than the absorption coefficient of fundamental horizontal lateral mode.

According to the present invention, the ridge may be in any form (in plan view) without specific restrictions. It may be in a stripe form, taper form, or flare form.

The fact that the insulating film and the absorption film have film thicknesses which are respectively established such that the absorption coefficient of high-order horizontal lateral mode is larger than the absorption coefficient of fundamental horizontal lateral mode suppresses the high-order horizontal lateral mode and increases the kink level in the high output region without the necessity of reducing the ridge width, and also increases the value of $\Delta n$ and the value of $\theta_{//}$.

According to the present invention, the insulating film is not specifically restricted in its kind so long as it is transparent to the oscillation wavelength, and the absorption film is not specifically restricted in its kind so long as it absorbs the oscillation wavelength.

"Insulating film substantially transparent to the oscillation wavelength" means a film whose absorption edge is shorter than the oscillation wavelength. "Absorption film" means a film whose absorption edge is longer than the oscillation wavelength.

According to the present invention, the insulating film may be any of an $SiO_2$ film, $Al_2O_3$ film, AlN film, $SiN_x$ film, $Ta_2O_5$ film, and $ZrO_2$ film, and the absorption film may be an Si film which is usually an amorphous Si film.

The insulating film such as $SiO_2$ film, Si film, and $ZrO_2$ film should preferably be formed by vapor deposition.

The semiconductor laser device of the present invention has a resonator structure of nitride based III-V group compound semiconductor layer formed on a substrate and also has an AlGaN cladding layer (as an upper cladding layer) whose upper portion is formed as the ridge. In this semiconductor laser device, the insulating film ($SiO_2$ film) has a thickness of 200 Å to 800 Å and the absorption film (Si film) has a thickness of 50 Å and above.

The thickness of the Si film, which is 50 Å and above, has been established from the following simulation. The simulation was run with a model in which the insulating film consists of an $SiO_2$ film with a constant thickness of 600 Å and an Si film with a varied thickness, as shown in FIG. 16A. Calculations by this simulation predicted the change in absorption coefficient of the fundamental horizontal lateral mode and the primary horizontal lateral mode, as shown in FIG. 16B. The curve (1) represents the absorption coefficient of fundamental horizontal lateral mode, and the curve (2) represents the absorption coefficient of primary horizontal lateral mode.

Since it is desirable that the absorption coefficient α of primary horizontal lateral mode be at least 10 cm$^{-1}$, the thickness of the Si film should be equal to or larger than 50 Å, preferably equal to or larger than 200 Å.

For desirable results, the thickness of the $SiO_2$ film as an insulating film should be 400 Å to 800 Å and the thickness of the Si film as an absorption film should be 50 Å and above. For more desirable results, the thickness of the $SiO_2$ film as an insulating film should be 400 Å to 800 Å and the thickness of the Si film as an absorption film should be 200 Å and above.

If the thickness of the $SiO_2$ film exceeds 800 Å, there will be no difference between the absorption coefficient of high-order horizontal lateral mode and the coefficient of fundamental horizontal lateral mode, which results in a small value of $\Delta n$. By contrast, if the thickness of the $SiO_2$ film is not more than 400 Å, the absorption coefficient of fundamental horizontal lateral mode is excessively small, which results in an increased threshold current.

The thickness of the $ZrO_2$ film as an insulating film should be 200 Å to 1200 Å and the thickness of the Si film as an absorption film should be 50 Å and above. For desirable results, the thickness of the $ZrO_2$ film as an insulating film should be 300 Å to 1100 Å and the thickness of the Si film as an absorption film should be 50 Å and above. For more desirable results, the thickness of the $ZrO_2$ film as an insulating film should be 600 Å to 1100 Å and the thickness of the Si film as an absorption film should be 200 Å and above.

If the thickness of the $ZrO_2$ film exceeds 1200 Å, there will be no difference between the absorption coefficient of high-order horizontal lateral mode and the coefficient of fundamental horizontal lateral mode, which results in a small value of $\Delta n$. By contrast, if the thickness of the $ZrO_2$ film is not more than 200 Å, the absorption coefficient of fundamental horizontal lateral mode is excessively small, which results in an increased threshold current.

Furthermore, the insulating film may be replaced by any of an $Al_2O_3$ film (200 Å to 1000 Å thick), an $SiN_x$ film (200 Å to 1200 Å thick), an AlN film (200 Å to 1400 Å thick), a $Ta_2O_5$ film (200 Å to 1200 Å thick), and a $ZrO_2$ film (200 Å to 1200 Å thick). The insulating film is combined with an Si film with a thickness of 50 Å and above as an absorption film to form the stacked film.

Alternatively, the stacked film may be a combination of a metal film as an absorption film and any of the following insulating films: an $Al_2O_3$ film (200 Å to 1000 Å thick), an $SiN_x$ film (200 Å to 1200 Å thick), an AlN film (200 Å to 1400 Å thick), a $Ta_2O_5$ film (200 Å to 1200 Å thick), and a $ZrO_2$ film (200 Å to 1000 Å thick).

The stacked film may also be formed from an $SiO_2$ film (100 Å to 800 Å thick) or a $ZrO_2$ film (200 Å to 1000 Å thick) as an insulating film and a metal film as an absorption film. The metal film may be formed from Ni, Pt, or Au with a thickness of 10, 100, or 300 nm, respectively. The metal film may function as an electrode.

DETAILED DESCRIPTION OF THE PREFERRED EMBODIMENTS

The embodiments of the present invention will be described specifically in more detail with reference to the accompanying drawings. As an illustration for easy understanding of the present invention, the following embodiments specify the film forming method, the composition and thickness of the compound semiconductor layers, the ridge width, and the process conditions. This illustration is not intended to restrict the scope of the present invention.

Embodiment 1

Figure 1:
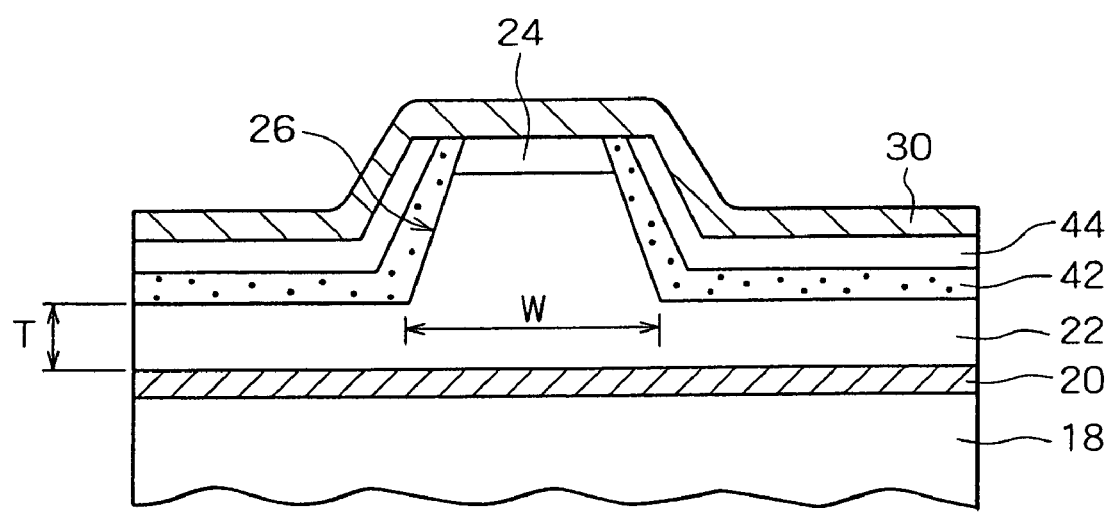
FIG. 1 is a sectional view showing the structure of essential parts of a nitride based semiconductor laser device according to Embodiment 1 and Example 1.

The present invention is embodied in a nitride based III-V group compound semiconductor laser device (referred to as "nitride based semiconductor laser device" hereinafter), which consists of essential parts shown in a sectional view in FIG. 1.

Figure 11:
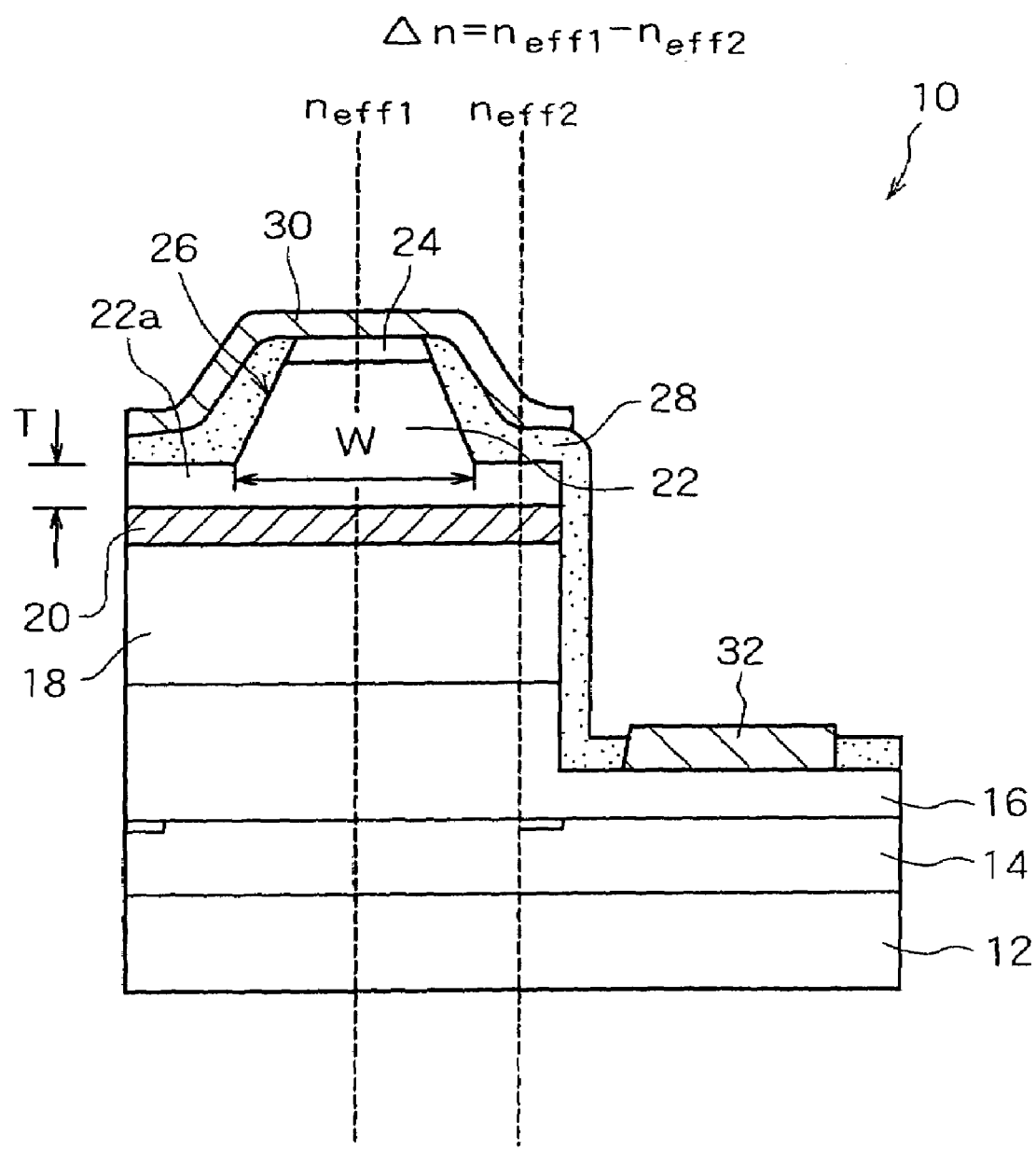
FIG. 11 is a sectional view showing the structure of the related-art nitride based semiconductor laser device.
Figure 12:
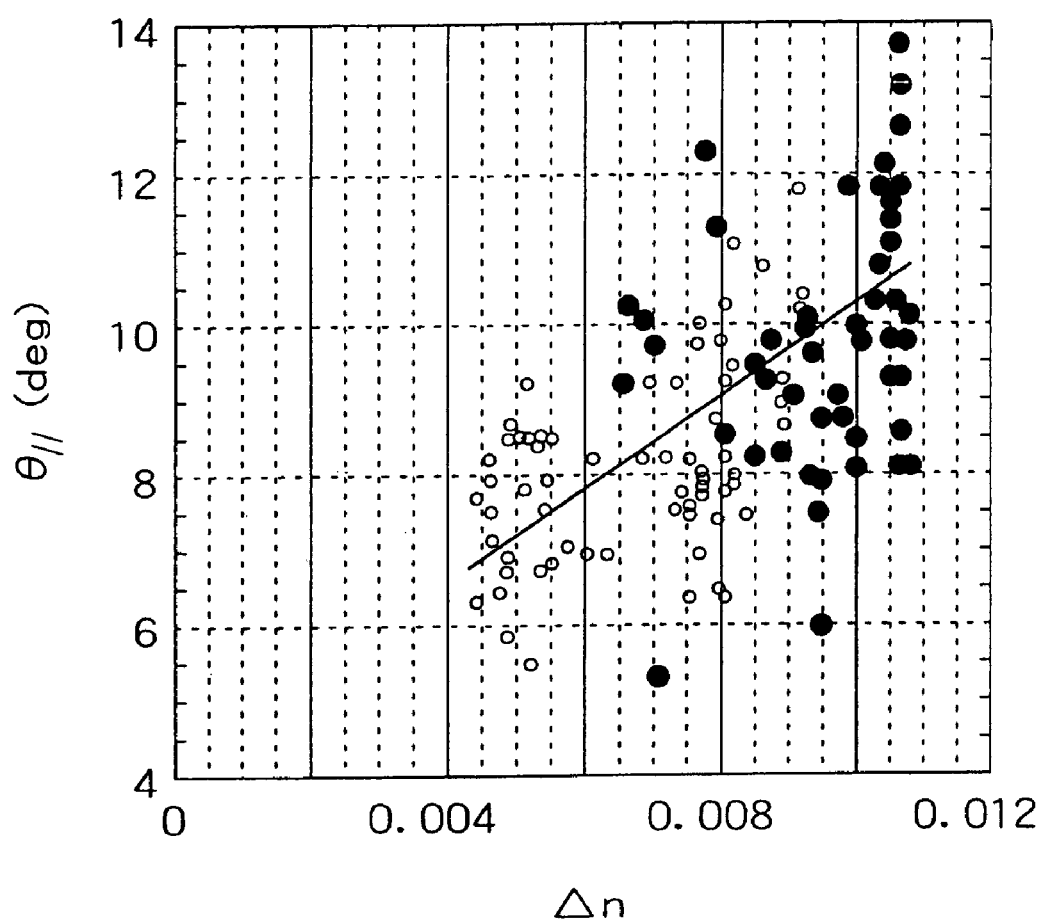
FIG. 12 is a graph showing the relation between the value of $\Delta n$ and the value of $\theta_{//}$ in a nitride based semiconductor laser device.
Figure 13:
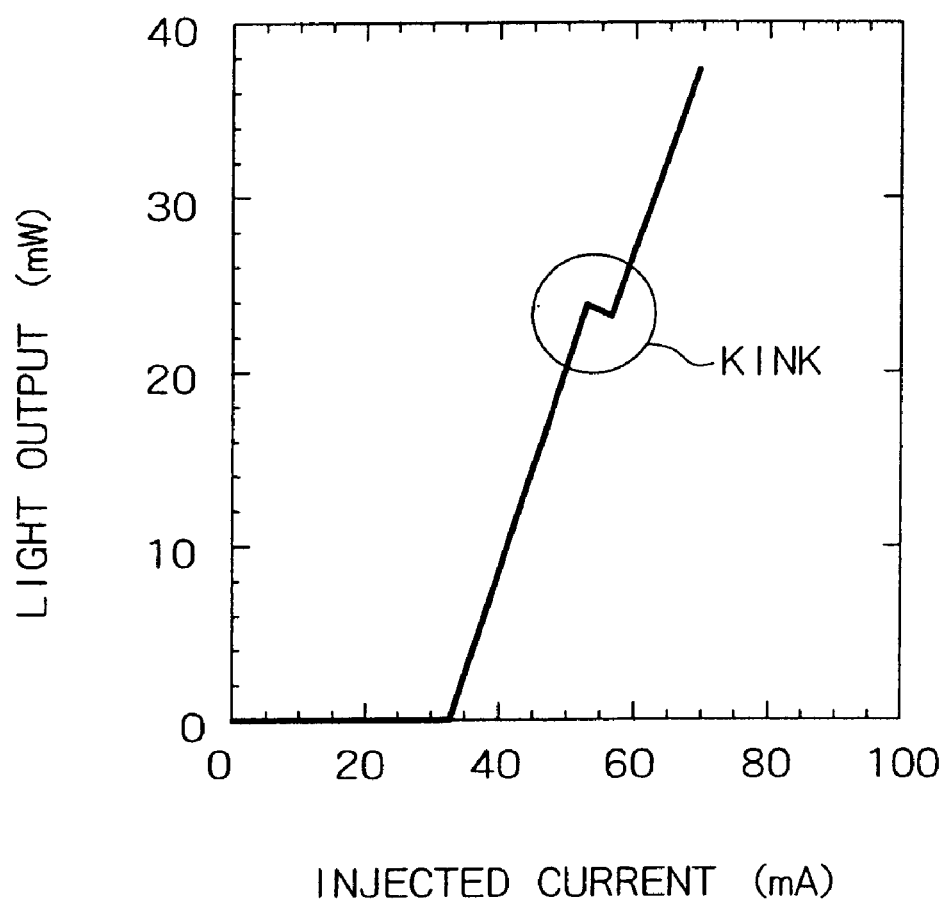
FIG. 13 is a graph showing the kink level in terms of light output-injection current characteristics.
Figure 14:
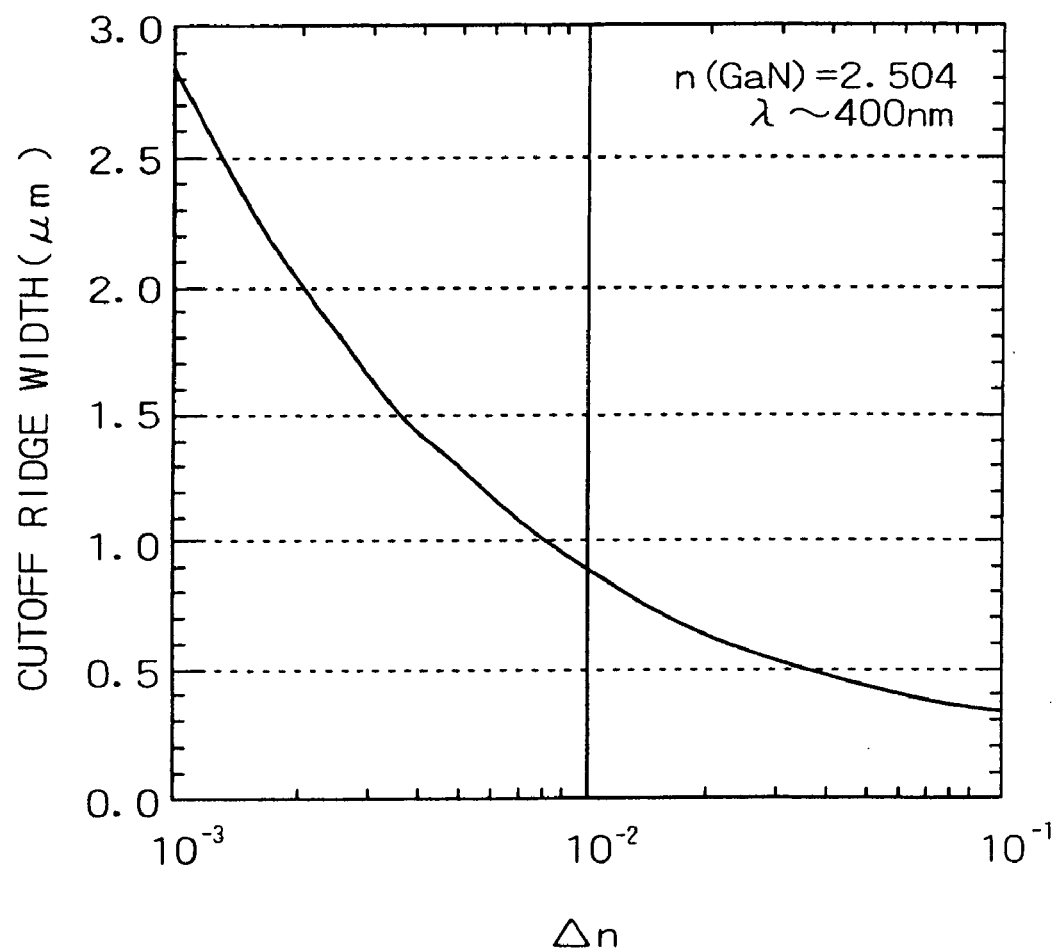
FIG. 14 is a graph showing the relation between the value of $\Delta n$ and the cutoff ridge width in a nitride based semiconductor laser device.
Figure 15:
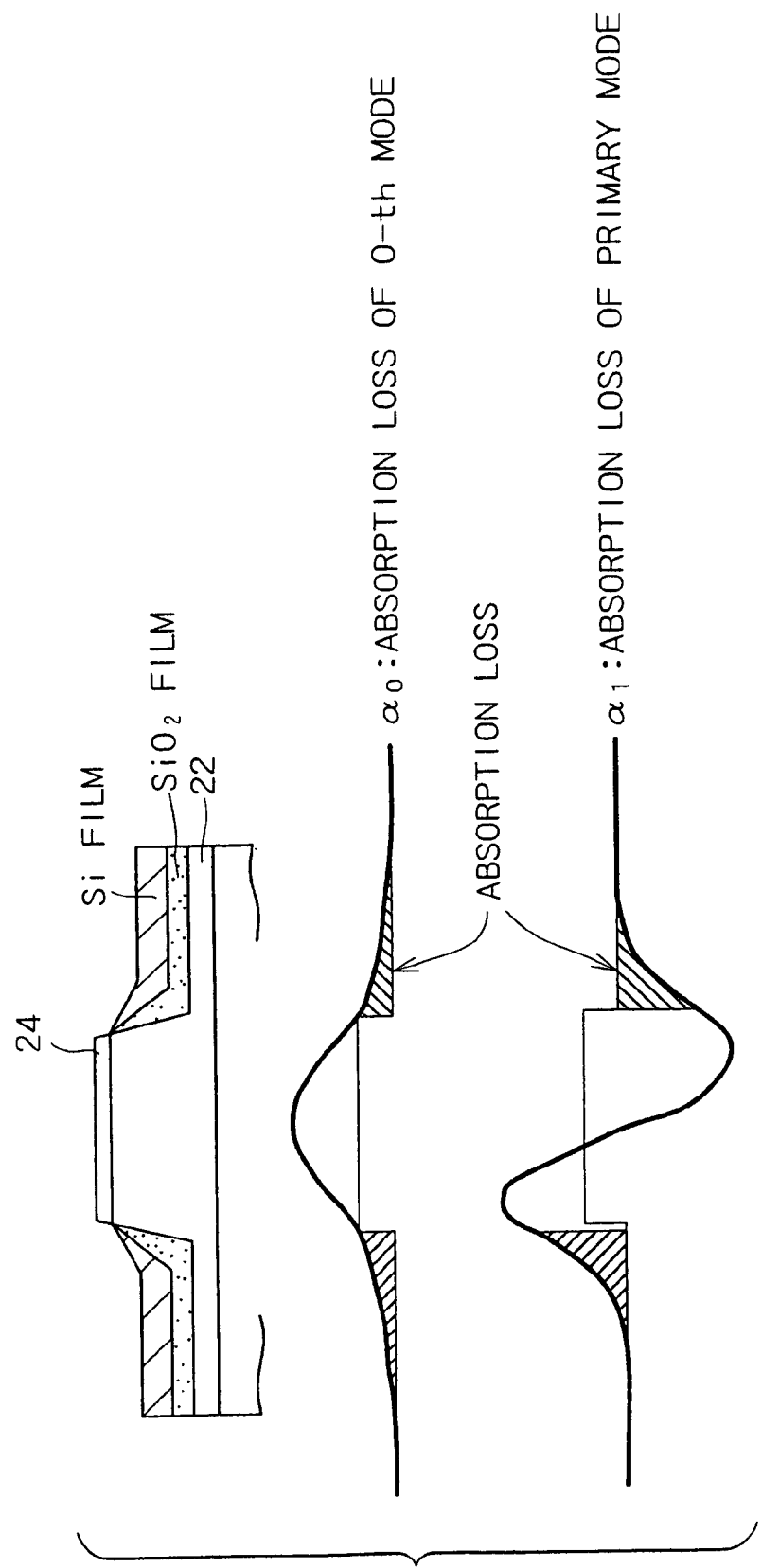
FIG. 15 is a schematic diagram showing the absorption loss in fundamental horizontal lateral mode and primary horizontal lateral mode.
Figure 16A:
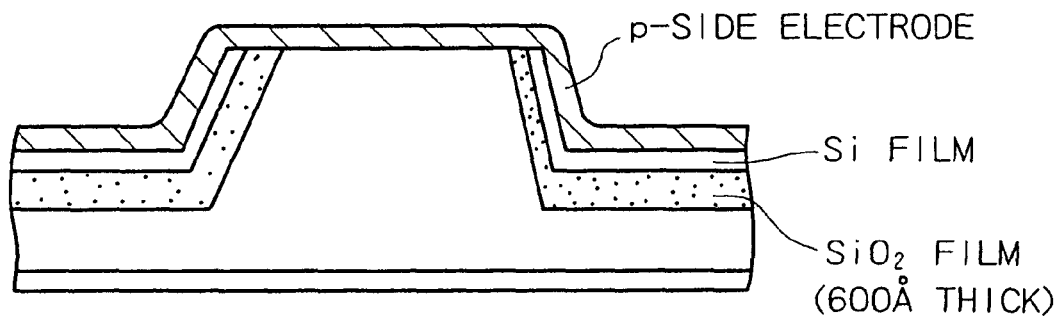
FIGS. 16A and 16B are graphs showing respectively the structure of a stacked film and the relation between the thickness of an Si film and the absorption coefficients of fundamental horizontal lateral mode and primary horizontal lateral mode.
Figure 16B:
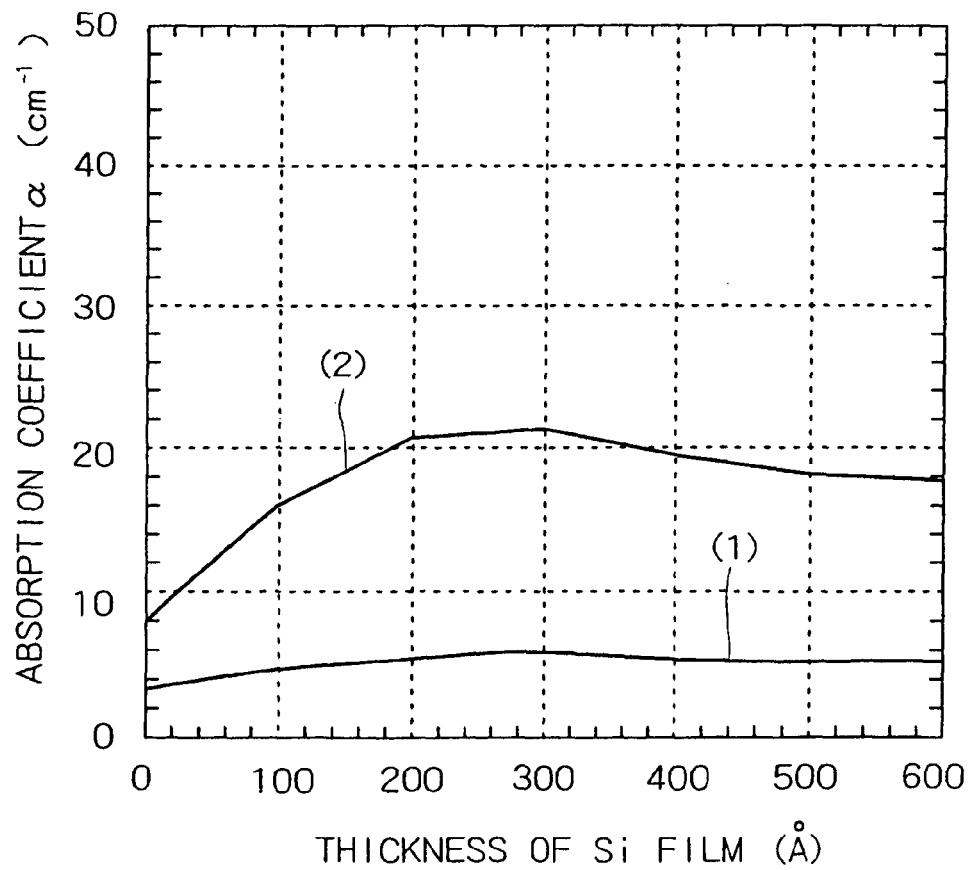

The nitride based semiconductor laser device consists of a substrate and a resonator structure composed of a nitride based III-V group compound semiconductor layer formed on the substrate. A ridge is formed in an upper layer of an upper cladding layer of AlGaN on the nitride based semiconductor laser device. The nitride based semiconductor laser device is similar in structure to the related-art nitride based semiconductor laser device 10 shown in FIG. 11, except for the current constricting layer on the upper cladding layer 22 extending sideward from the base of the ridge 26.

In this embodiment, the current constricting layer on the upper cladding layer 22 is a stacked film, formed on both sides of the ridge, composed of an $SiO_2$ film and an Si film. The $SiO_2$ film is substantially transparent to the light of the oscillation wavelength, and the Si film absorbs the light of the oscillation wavelength. Each of them has a specific thickness to suppress the high-order lateral mode.

In this embodiment, the p-side electrode 30 is electrically connected to the p-GaN contact layer 24 on the ridge 26 through a window in the stacked film.

The $SiO_2$ film and the Si film are formed sequentially by vapor deposition. The resulting stacked film has the window for the p-side electrode 30 formed by photolithography and reactive ion etching.

For the purpose of evaluation, various samples were prepared in which the thickness of the amorphous Si film 44 is fixed at 300 Å and the thickness of the $SiO_2$ film 42 is varied. The samples were examined for change in the absorption coefficient of fundamental horizontal lateral mode and the absorption coefficient of primary horizontal lateral mode. The results are shown in FIG. 2.

Figure 2:
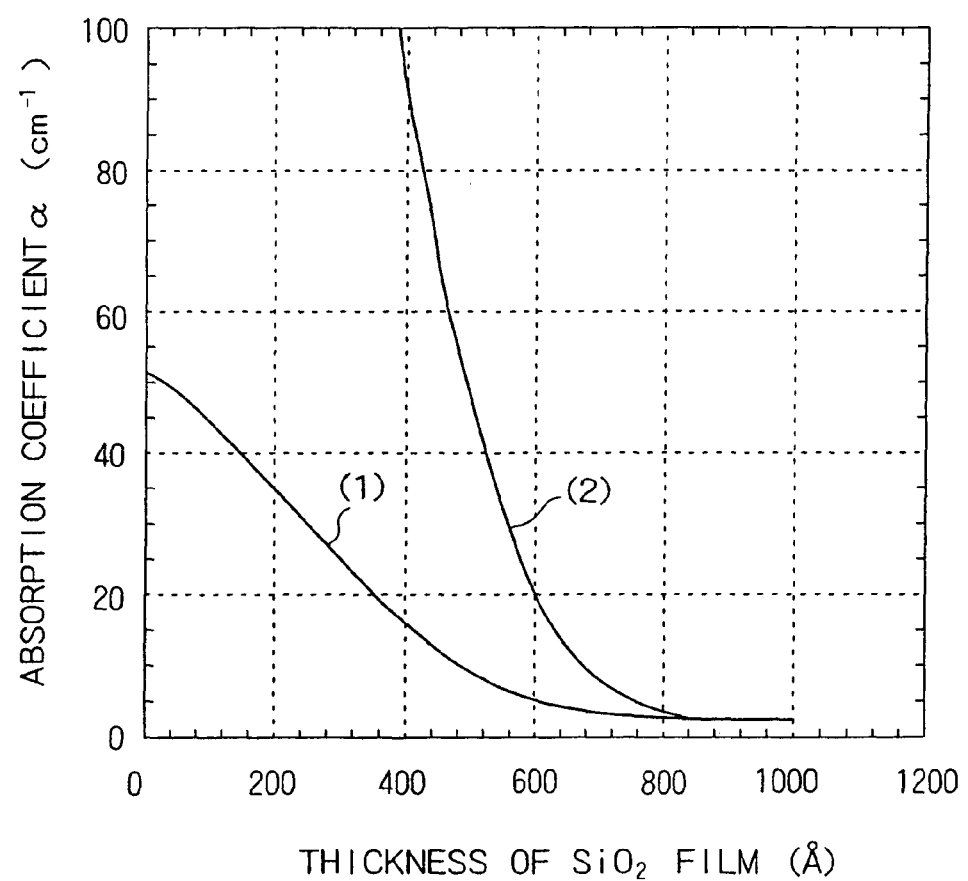
FIG. 2 is a graph showing the relation between the thickness of an $SiO_2$ film formed by vapor deposition and the absorption coefficients of fundamental horizontal lateral mode and primary horizontal lateral mode in the nitride based semiconductor laser device according to Embodiment 1.

Curve (1) in FIG. 2 represents the relation between the thickness of the $SiO_2$ film 42 and the absorption coefficient of fundamental horizontal lateral mode. Curve (2) in FIG. 2 represents the relation between the thickness of the $SiO_2$ film 42 and the absorption coefficient of primary horizontal lateral mode.

This embodiment is characterized by the ridge 26 having the $SiO_2$ film 42 and the amorphous Si film 44. This stacked structure keeps low the absorption coefficient of fundamental horizontal lateral mode as indicated by curve (1) in FIG. 2 and keeps high the absorption coefficient of primary horizontal lateral mode as indicated by curve (2) in FIG. 2. The result is an increased value of Δn with the ridge width remaining unchanged.

This embodiment requires that the $SiO_2$ film 42 have a thickness ranging from 400 Å to 800 Å. With a thickness not more than 400 Å, the absorption coefficient a of fundamental horizontal lateral mode is 15 $cm^{-1}$ or more, resulting in an increased threshold current and a decreased light-emitting efficiency. With a thickness not less than 800 Å, the absorption coefficient of primary horizontal lateral mode comes close to the absorption coefficient of fundamental horizontal lateral mode, resulting in a decreased value of Δn.

In a modified embodiment, samples of a nitride based semiconductor laser device of related-art structure were prepared which differ in that the insulating film is an $SiO_2$ deposited film (600 Å thick) and the absorption film is an amorphous Si deposited film (400 Å thick) and the upper cladding layer 22 has a varied thickness in its parts extending sideward from the base of the ridge. Because of this structure, the samples vary in the effective refractive index difference (Δn) of the ridge waveguide. They were examined for relation between the value of Δn and the kink level.

Figure 3:
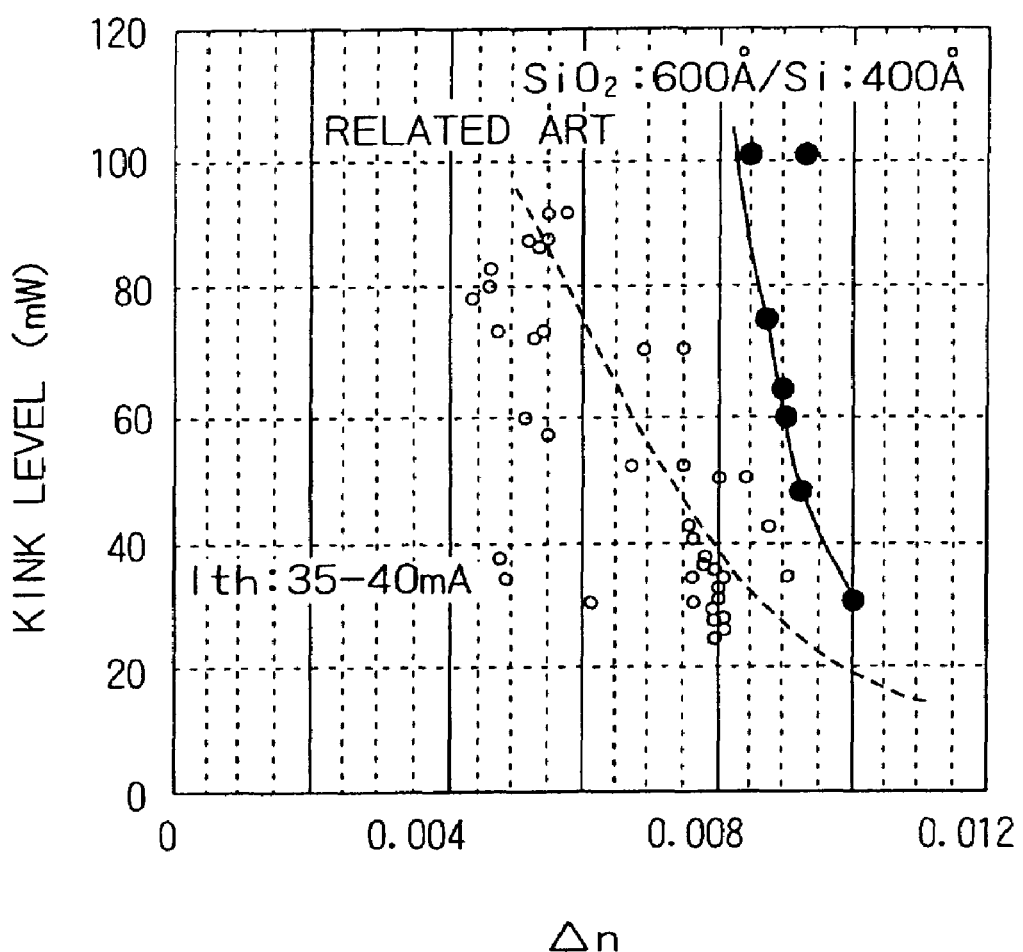
FIG. 3 is a graph showing the relation between the effective refractive index difference $\Delta n$ and the kink level in both the nitride based semiconductor laser device according to Embodiment 1 and a related-art nitride based semiconductor laser device.

It is noted from the results shown in FIG. 3 that the samples have higher values of Δn for the same kink level as compared with the related-art semiconductor laser devices. For example, the samples have the values of Δn at 0.009 and 0.0085 for the values of kink level at 60 mW and 100 mW, respectively, whereas the related-art semiconductor laser devices have the values of Δn at 0.0065 and 0.0045 for the values of kink level at 60 mW and 100 mW, respectively. These small kink levels lead to a small value of $\theta_{//}$.

Figure 4:
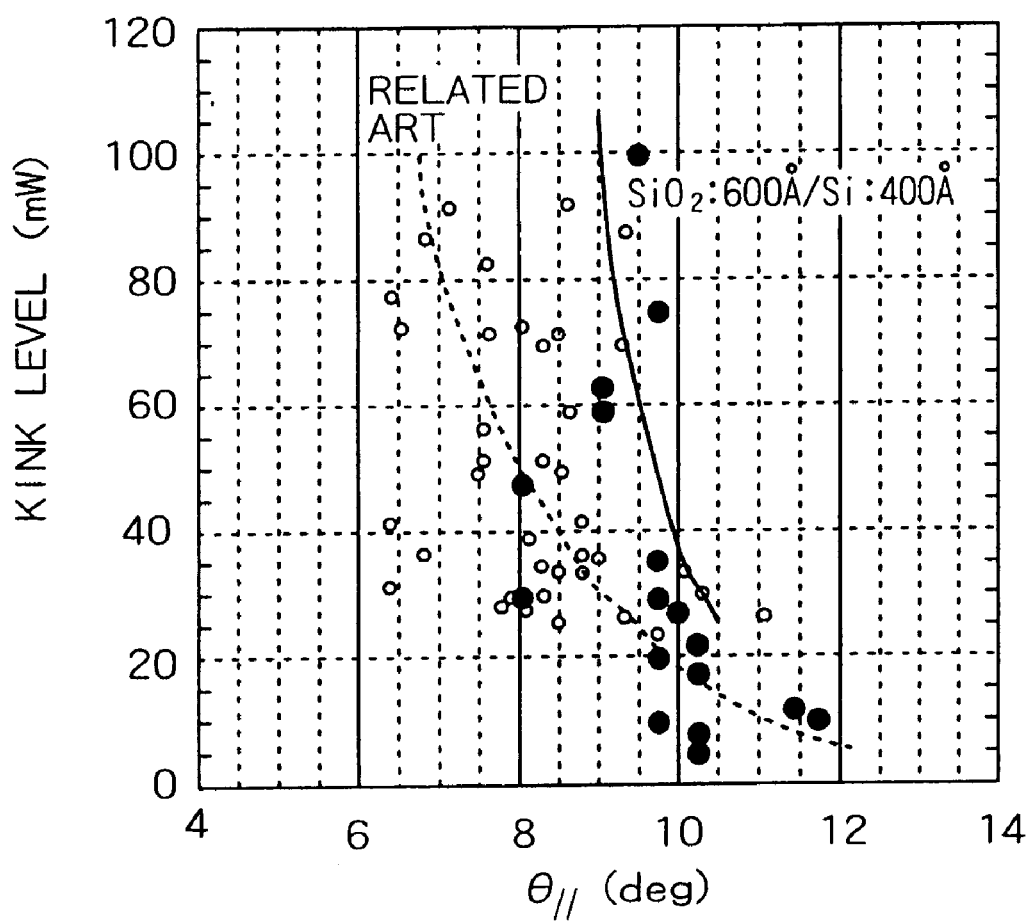
FIG. 4 is a graph showing the relation between the half-width value $\theta_{//}$ of a far field pattern (FFP) in a direction horizontal to a hetero interface and the kink level in both the nitride based semiconductor laser device according to Embodiment 1 and the related-art nitride based semiconductor laser device.

The samples mentioned above were examined for relation between the kink level and the value of $\theta_{//}$. The results are shown in FIG. 4. It is noted from FIG. 4 that the samples have higher values of $\theta_{//}$ for the same kink level as compared with the related-art semiconductor laser devices.

The foregoing suggests that the nitride based semiconductor laser device according to this embodiment has a low drive current, a high kink level, and a high value of $\theta_{//}$.

EXAMPLE 1

A concrete example of Embodiment 1 is illustrated by a sample of a nitride based III-V group compound semiconductor laser device having an oscillation wavelength of around 410 nm. This sample has the same structure as the related-art semiconductor laser device 10 shown in FIG. 11 except for the current constricting layer in the ridge 26. As in the related-art semiconductor laser device 10, the width of the ridge 26 is 1.7 μm and the thickness of the p-AlGaN cladding layer 22 extending sideward from the base of the ridge 26 is 0.17 μm.

The sample in this example has a stacked film composed of an $SiO_2$ film 42 (600 Å thick) and an amorphous Si film 44 (300 Å thick), which are sequentially formed by vapor deposition. This stacked film covers the sides of the ridge 26 and the p-AlGaN cladding layer 22 extending sideward from the base of the ridge 26. The stacked film has a window through which the p-side electrode 30 is electrically connected to the p-GaN contact layer 24.

Owing to the above-mentioned structure, the nitride based semiconductor laser device of this example has a kink level of 100 mW and a value of $\theta_{//}$ of 9.5°.

Embodiment 2

Figure 5:
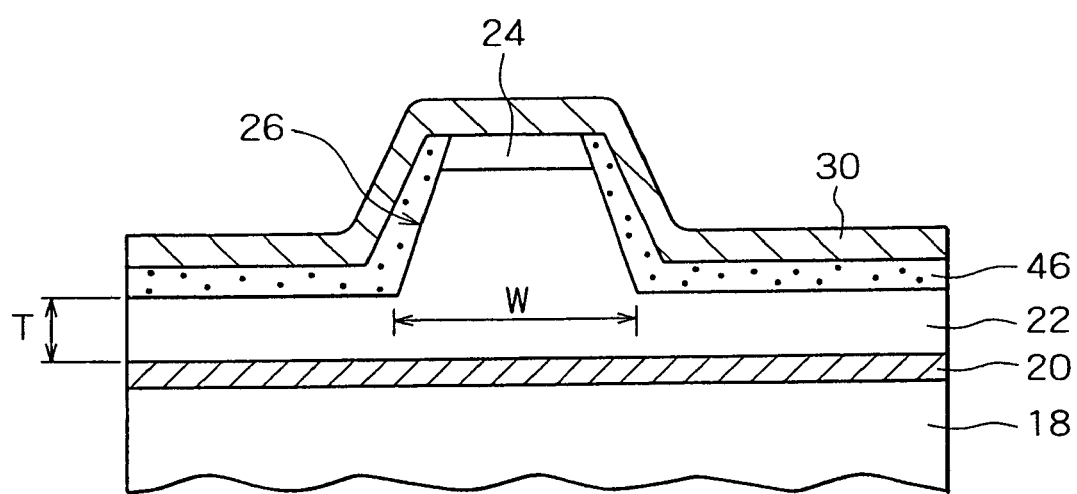
FIG. 5 is a sectional view showing the structure of essential parts of a nitride based semiconductor laser device according to Embodiment 2 and Example 2.

The second embodiment of the present invention is a nitride based semiconductor laser device whose essential parts are constructed as shown in a sectional view in FIG. 5.

The sample in this embodiment is similar in structure to that in Embodiment 1 except for the current constricting layer in the ridge 26. The sample in this embodiment has a stacked film composed of an $SiO_2$ film 46 as an insulating film and a p-side electrode 30 as an absorption film, sequentially. As shown in FIG. 5, this stacked film covers the sides of the ridge 26 and the p-AlGaN cladding layer 22 extending sideward from the base of the ridge 26.

For the purpose of evaluation, several samples were prepared in which the p-side electrode 30 has a fixed thickness (40 nm) and the $SiO_2$ film 46 has a varied thickness. They were tested for change in the absorption coefficient of fundamental horizontal lateral mode and the absorption coefficient of primary horizontal lateral mode. The results are shown in FIG. 6.

Figure 6:
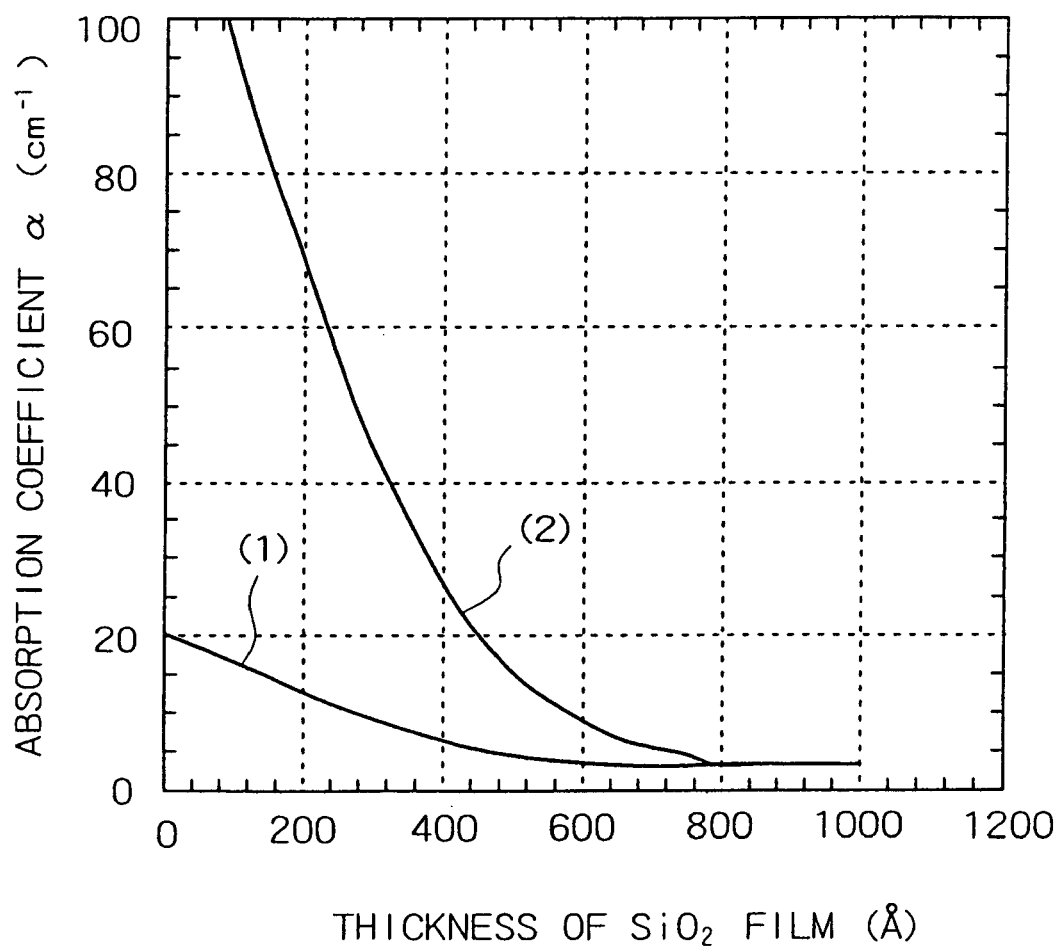
FIG. 6 is a graph showing the relation between the thickness of an $SiO_2$ film formed by vapor deposition and the absorption coefficients of fundamental horizontal lateral mode and primary horizontal lateral mode in the nitride based semiconductor laser device according to Embodiment 2.

Curve (1) in FIG. 6 represents the relation between the thickness of the $SiO_2$ film 46 and the absorption coefficient of fundamental horizontal lateral mode. Curve (2) in FIG. 6 represents the relation between the thickness of the $SiO_2$ film 46 and the absorption coefficient of primary horizontal lateral mode. In both cases, the thickness of the p-side electrode 30 is fixed at 40 nm.

In this embodiment, the ridge 26 has a stacked film composed of the SiO$_2$ film 46 and the p-side electrode 30. This structure keeps the absorption coefficient of fundamental horizontal lateral mode low as indicated by curve (1) and keeps the absorption coefficient of primary horizontal lateral mode high as indicated by curve (2). Therefore, the samples have a larger value of Δn without change in the ridge width.

This embodiment requires that the SiO$_2$ film 46 have a thickness ranging from 100 Å to 800 Å. With a thickness not more than 100 Å, the absorption coefficient a of fundamental horizontal lateral mode is 15 cm$^{-1}$ or more, resulting in an increased threshold current and a decreased light-emitting efficiency. With a thickness not less than 800 Å, the absorption coefficient of primary horizontal lateral mode comes close to the absorption coefficient of fundamental horizontal lateral mode, resulting in a decreased value of Δn.

The foregoing suggests that the nitride based semiconductor laser device according to this embodiment has a low drive current, a high kink level, and a high value of θ$_{//}$.

EXAMPLE 2

A concrete example of Embodiment 2 is illustrated by a sample of a nitride based III-V group compound semiconductor laser device having an oscillation wavelength of around 410 nm. This sample has the same structure as the related-art semiconductor laser device 10 shown in FIG. 11 except for the current constricting layer in the ridge 26. It is identical with the related-art semiconductor laser device 10 in the width W of the ridge 26 and the thickness T of the p-AlGaN cladding layer 22 extending sideward from the base of the ridge 26.

The sample in this example has a stacked film composed of an SiO$_2$ film 46 (400 Å thick) and a p-side electrode 30 which is a metal film of Ni/Pt/Au with a thickness of 10/100/300 nm, respectively, which are sequentially formed by vapor deposition. This stacked film covers the sides of the ridge 26 and the p-AlGaN cladding layer 22 extending sideward from the base of the ridge 26, as shown in FIG. 5. The SiO$_2$ film 46 has a window through which the p-side electrode 30 is electrically connected to the p-GaN contact layer 24.

Owing to the above-mentioned structure, the nitride based compound semiconductor laser device of this example has a kink level of 80 mW and a value of θ$_{//}$ of 9.8°.

Embodiment 3

Figure 7:
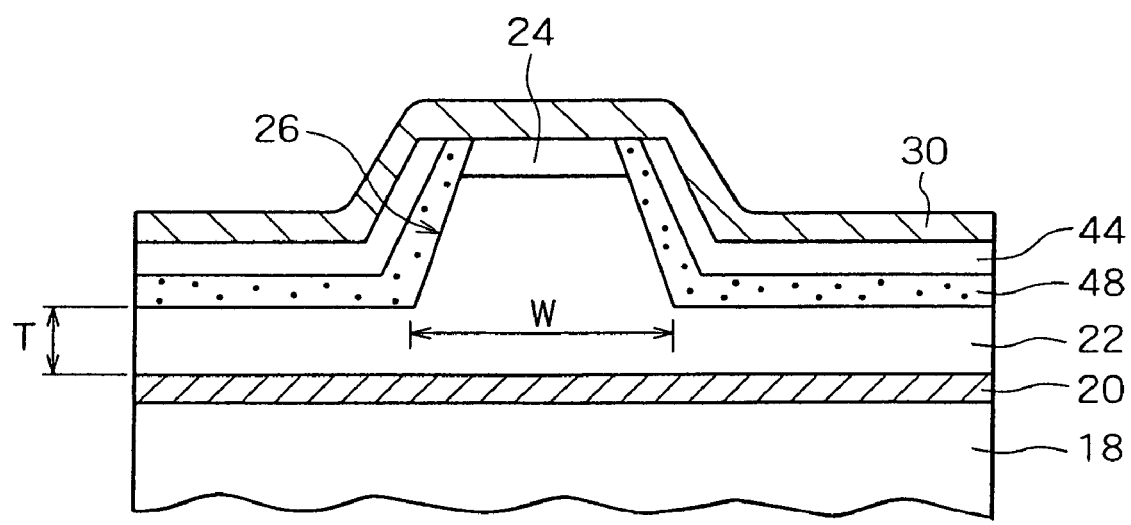
FIG. 7 is a sectional view showing the structure of essential parts of a nitride based semiconductor laser device according to Embodiment 3 and Example 3.

The third embodiment of the present invention is a nitride based semiconductor laser device whose essential parts are constructed as shown in a sectional view in FIG. 7.

The sample in this embodiment is similar in structure to that in Embodiment 1 except for the insulating film. The sample in this embodiment has a stacked film composed of a ZrO$_2$ film 48 as an insulating film and an amorphous Si film 44 (as an absorption film), both formed sequentially by vapor deposition. As shown in FIG. 7, this stacked film covers the sides of the ridge 26 and the p-AlGaN cladding layer 22 extending sideward from the base of the ridge 26.

For the purpose of evaluation, several samples were prepared in which the amorphous Si film 44 has a fixed thickness (300 Å) and the ZrO$_2$ film 48 has a varied thickness. They were tested for change in the absorption coefficient of fundamental horizontal lateral mode and the absorption coefficient of primary horizontal lateral mode. The results are shown in FIG. 8.

Figure 8:
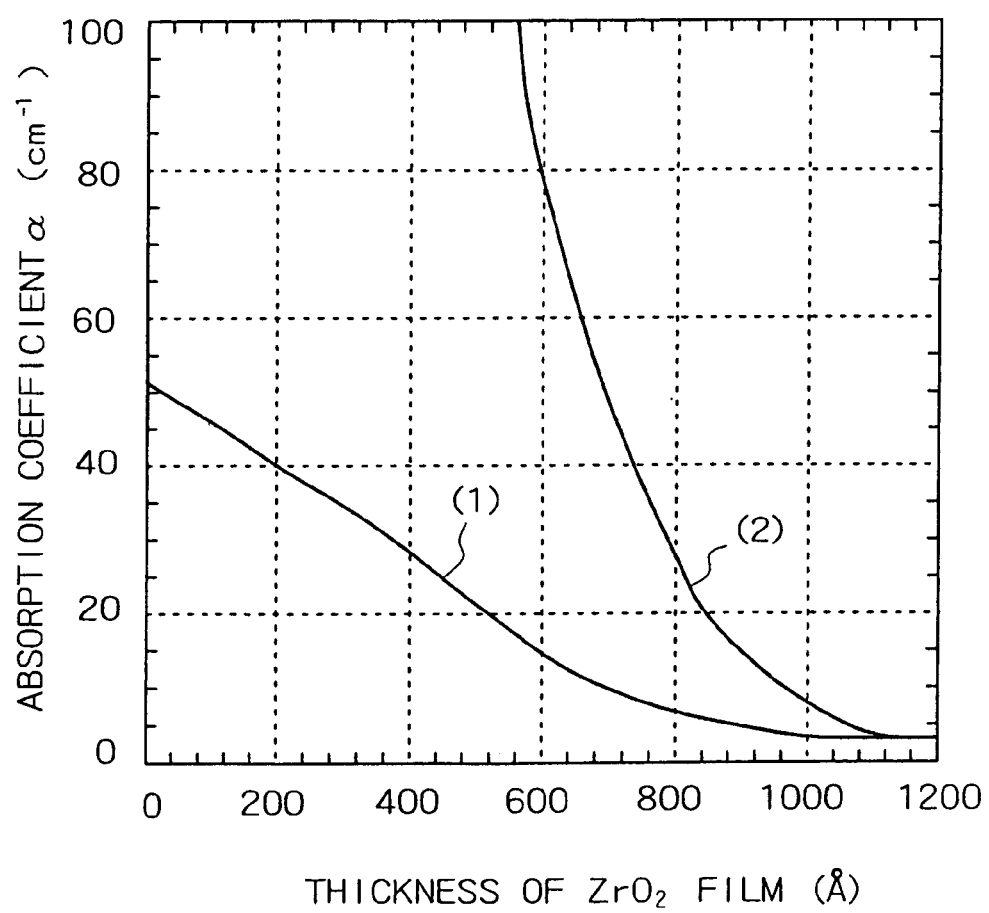
FIG. 8 is a graph showing the relation between the thickness of a $ZrO_2$ film formed by vapor deposition and the absorption coefficients of fundamental horizontal lateral mode and primary horizontal lateral mode in the nitride based semiconductor laser device according to Embodiment 3.

Curve (1) in FIG. 8 represents the relation between the thickness of the ZrO$_2$ film 48 and the absorption coefficient of fundamental horizontal lateral mode. Curve (2) in FIG. 8 represents the relation between the thickness of the ZrO$_2$ film 48 and the absorption coefficient of primary horizontal lateral mode. In both cases, the thickness of the amorphous Si film 44 is fixed at 300 Å.

In this embodiment, the ridge 26 has a stacked film composed of the ZrO$_2$ film 48 and the amorphous Si film 44. This structure keeps the absorption coefficient of fundamental horizontal lateral mode low as indicated by curve (1) and keeps the absorption coefficient of primary horizontal lateral mode high as indicated by curve (2). Therefore, the samples have a larger value of Δn without change in the ridge width.

This embodiment requires that the ZrO$_2$ film 48 have a thickness ranging from 600 Å to 1100 Å. With a thickness not more than 600 Å, the absorption coefficient a of fundamental horizontal lateral mode is 15 cm$^{-1}$ or more, resulting in an increased threshold current and a decreased light-emitting efficiency. With a thickness not less than 1100 Å, the absorption coefficient of primary horizontal lateral mode comes close to the absorption coefficient of fundamental horizontal lateral mode, resulting in a decreased value of Δn.

The foregoing suggests that the nitride based semiconductor laser device according to this embodiment has a low drive current, a high kink level, and a high value of θ$_{//}$.

EXAMPLE 3

A concrete example of Embodiment 3 is illustrated by a sample of a nitride based semiconductor laser device, which has the same structure as that in Example 1 except for the insulating film on the ridge 26. This insulating film is the ZrO$_2$ film 48 (800 Å thick) in place of the SiO$_2$ film 42 (600 Å thick).

Owing to the above-mentioned structure, the nitride based semiconductor laser device of this example has a kink level of 95 mW and a value of θ$_{//}$ of 9.6°.

Embodiment 4

Figure 9:
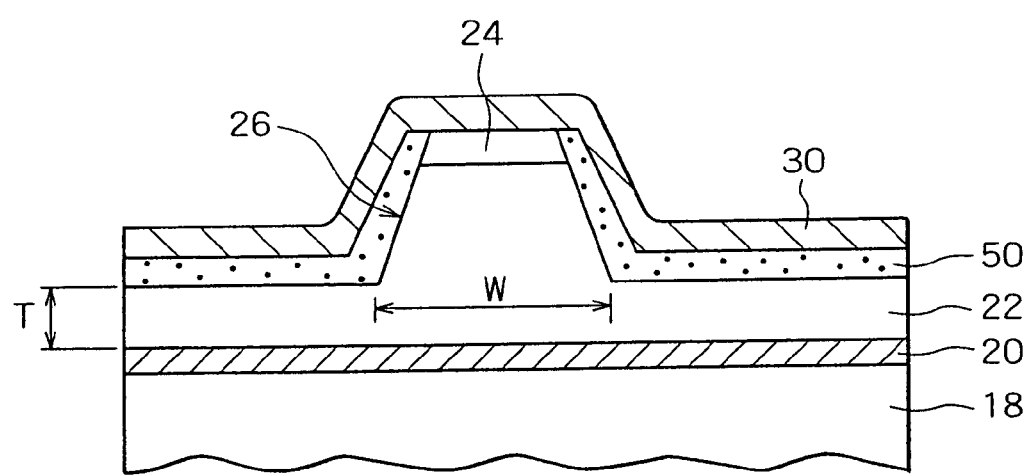
FIG. 9 is a sectional view showing the structure of essential parts of a nitride based semiconductor laser device according to Embodiment 4 and Example 4.

The fourth embodiment of the present invention is a nitride based semiconductor laser device whose essential parts are constructed as shown in a sectional view in FIG. 9.

The sample in this embodiment is similar in structure to that in Embodiment 2 except for the insulating film formed on the ridge 26. The sample in this embodiment has a stacked film composed of a ZrO$_2$ film 50 as an insulating film and a p-side electrode 30 as an absorption film, sequentially. As shown in FIG. 9, this stacked film covers the sides of the ridge 26 and the p-AlGaN cladding layer 22 extending sideward from the base of the ridge 26.

For the purpose of evaluation, several samples were prepared in which the p-side electrode 30 has a fixed thickness (40 nm) and the ZrO$_2$ film 50 has a varied thickness. They were tested for change in the absorption coefficient of fundamental horizontal lateral mode and the absorption coefficient of primary horizontal lateral mode. The results are shown in FIG. 10.

Figure 10:
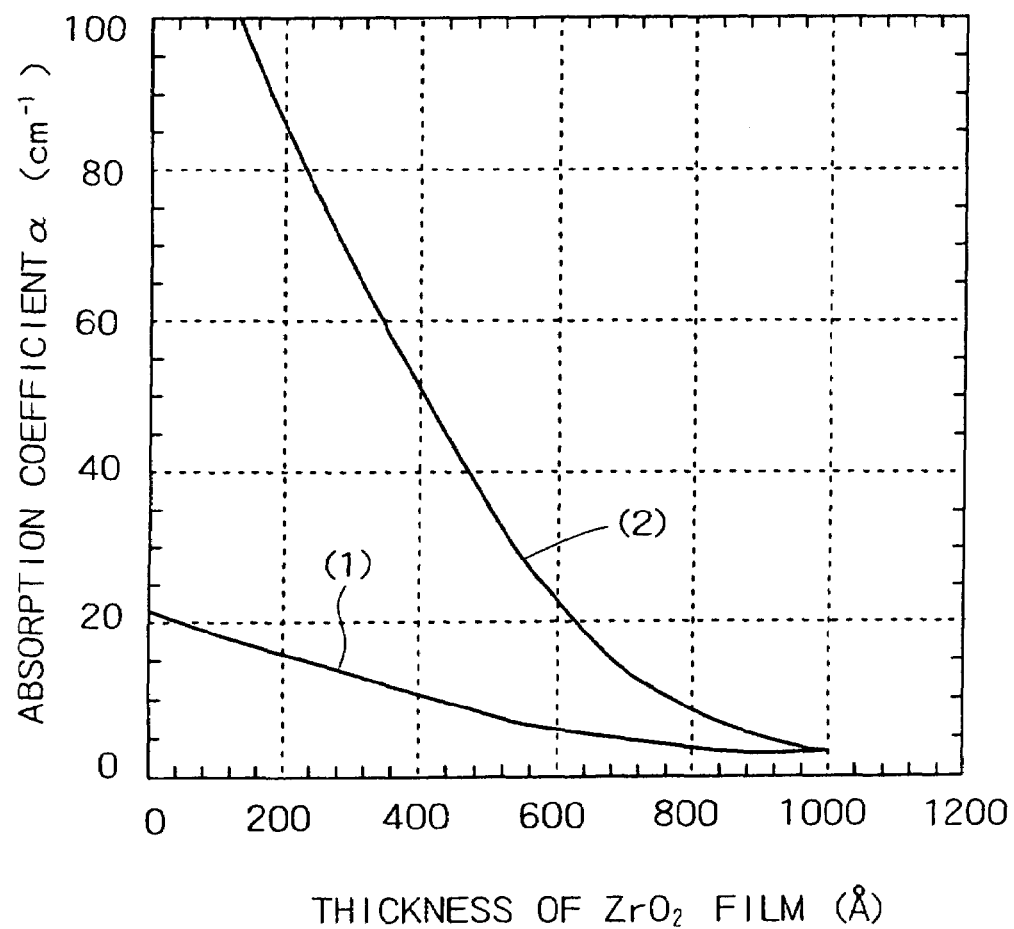
FIG. 10 is a graph showing the relation between the thickness of a $ZrO_2$ film formed by vapor deposition and the absorption coefficients of fundamental horizontal lateral mode and primary horizontal lateral mode in the nitride based semiconductor laser device according to Embodiment 4.

Curve (1) in FIG. 10 represents the relation between the thickness of the ZrO$_2$ film 50 and the absorption coefficient of fundamental horizontal lateral mode. Curve (2) in FIG. 10 represents the relation between the thickness of the ZrO$_2$ film 50 and the absorption coefficient of primary horizontal lateral mode. In both cases, the thickness of the p-side electrode 30 is fixed at 40 nm.

In this embodiment, the ridge 26 has a stacked film composed of the ZrO$_2$ film 50 and the p-side electrode 30. This structure keeps the absorption coefficient of fundamental horizontal lateral mode low as indicated by curve (1) and keeps the absorption coefficient of primary horizontal lateral mode high as indicated by curve (2). Therefore, the samples have a larger value of Δn without change in the ridge width.

This embodiment requires that the $ZrO_2$ film 50 have a thickness ranging from 200 Å to 1000 Å. With a thickness not more than 200 Å, the absorption coefficient a of fundamental horizontal lateral mode is 15 $cm^{-1}$ or more, resulting in an increased threshold current and a decreased light-emitting efficiency. With a thickness not less than 1000 Å, the absorption coefficient of primary horizontal lateral mode comes close to the absorption coefficient of fundamental horizontal lateral mode, resulting in a decreased value of Δn.

The foregoing suggests that the nitride based semiconductor laser device according to this embodiment has a low drive current, a high kink level, and a high value of $\theta_{//}$.

EXAMPLE 4

A concrete example of Embodiment 2 is illustrated by a sample of a nitride based III-V group compound semiconductor laser device having an oscillation wavelength of around 410 nm. This sample has the same structure as that in Example 2 except for the insulating film.

The sample in this example has a stacked film composed of a $ZrO_2$ film 50 (600 Å thick) and a p-side electrode 30 which is a metal film of Ni/Pt/Au having a thickness of 10/100/300 nm, respectively, which are sequentially formed by vapor deposition. This stacked film covers the sides of the ridge 26 and the p-AlGaN cladding layer 22 extending sideward from the base of the ridge 26, as shown in FIG. 9. The $ZrO_2$ film 50 has a window through which the p-side electrode 30 is electrically connected to the p-GaN contact layer 24.

Owing to the above-mentioned structure, the nitride based semiconductor laser device of this example has a kink level of 100 mW and a value of $\theta_{//}$ of 9.5°.

The above-mentioned Examples 1 to 4 demonstrate specific cases in which the thicknesses of the insulating film and the absorption film are adequate when the ridge 26 has the width W of 1.7 μm and the remaining portion of the p-AlGaN cladding layer 22 has a thickness of 0.17 μm. The adequate film thicknesses vary depending on the shape and dimensions of the ridge.

The above-mentioned Examples 1 to 4 are not intended to restrict the width of the ridge, the thickness of the cladding layer extending sideward from the base of the ridge, and the thickness and kind of the insulating film, so long as the semiconductor laser device is constructed such that the absorption coefficient of primary mode is larger than that of fundamental mode.

According to the present invention, the nitride based III-V group compound semiconductor laser device of ridge waveguide type has a stacked film composed of an insulating film substantially transparent to the oscillation wavelength and an absorption film, on the insulating film, which absorbs the oscillation wavelength, the stacked film covering the sides of the ridge and also covering the cladding layer extending sideward from the base of the ridge. The insulating film and the absorption film have specific thicknesses respectively so that the absorption coefficient of high-order horizontal lateral mode is larger than the absorption coefficient of fundamental horizontal lateral mode. The above-mentioned unique structure results in a higher kink level, a larger value of Δn, and a larger value of $\theta_{//}$, while suppressing the high-order horizontal lateral mode, without the necessity of reducing the width of the ridge.

The high kink level contributes to improved noise characteristics, and the larger value of Δn contributes to an increased process margin.

Moreover, the high kink level implies that the resonator can have a more freely selected length and the ridge can have a larger width. The related-art structure restricts the resonance length because the kink level depends on the resonance length, and it also makes it necessary to reduce the ridge width to increase the kink level because the kink level depends on the ridge width. The result is a decrease in a drive voltage and an improvement in long-term reliability.

What is claimed is:

1. A semiconductor laser device of ridge waveguide type comprising:
   a substrate;
   a resonator structure operatively formed on the substrate to generate a laser light and having upper and lower cladding layers and an active layer between the cladding layers;
   a ridge formed in an upper portion of at least the upper cladding layer;
   a stacked film comprising an insulating film that is substantially transmissive of the laser light and an absorption film that absorbs the laser light and that is formed on the insulating; and
   an electrode film, wherein, the stacked film is formed on both sides of the ridge and on those portions of the upper cladding layer extending sideward from the base of the ridge, the electrode film formed over the stacked film and is electrically connected to an upper surface of the ridge through a window in the stacked film, and the insulating film and the absorption film have respective thicknesses such that the absorption coefficient of high-order horizontal lateral mode is larger than the absorption coefficient of fundamental horizontal lateral mode,
   wherein,
   the insulating film is any of an $SiO_2$ film, an $Al_2O_3$ film, an $SiN_X$ film, an AlN film, a $Ta_XO_5$ film, and a $ZrO_2$ film, and the absorption film is a metal film.

2. A semiconductor laser device as defined in claim 1, wherein the metal film as an absorption film functions as an electrode which is electrically connected to an upper surface of the ridge through a window in the insulating film.

3. A semiconductor laser device as defined in claim 2, wherein a resonator structure composed of nitride based 111-V group compound semiconductor layers is formed on the substrate, and a ridge is formed in an upper layer of an upper cladding layer composed of AlGaN.

4. A semiconductor laser device as defined in claim 1, wherein the insulating film is an $Al_2O_3$ film having a thickness of 100 Å to 800 Å.

5. A semiconductor laser device as defined in claim 1, wherein the insulating film is an $SiN_X$ film having a thickness of 200 Å to 1000 Å.

6. A semiconductor laser device as defined in claim 1, wherein the insulating film is an AlN film having a thickness of 200 Å to 1200 Å.

7. A semiconductor laser device as defined in claim 1, wherein the insulating film is a $Ta_2O_5$ film having a thickness of 200 Å.

8. A semiconductor laser device as defined in claim 1, wherein the insulating film is a $ZrO_2$ film having a thickness of 200 Å to 1000 Å.

9. A semiconductor laser device as defined in claim 1, wherein the insulating film is an $SiO_2$ film having a thickness of 200 Å to 800 Å.

* * * * *